(12) United States Patent
Lee et al.

(10) Patent No.: US 7,196,004 B2
(45) Date of Patent: *Mar. 27, 2007

(54) METHOD AND FABRICATING SEMICONDUCTOR DEVICE

(75) Inventors: Min-Suk Lee, Ichon-shi (KR); Sung-Kwon Lee, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 80 days.

This patent is subject to a terminal disclaimer.

(21) Appl. No.: 10/924,720

(22) Filed: Aug. 23, 2004

(65) Prior Publication Data

US 2005/0136649 A1 Jun. 23, 2005

(30) Foreign Application Priority Data

Dec. 22, 2003 (KR) .................. 10-2003-0094511
Jun. 7, 2004 (KR) .................. 10-2004-0041516

(51) Int. Cl.
*H01L 21/4763* (2006.01)
*H01L 21/425* (2006.01)
*H01L 21/302* (2006.01)
*H01L 21/461* (2006.01)

(52) U.S. Cl. .................. 438/637; 438/514; 438/710; 438/724

(58) Field of Classification Search ................ 438/637, 438/737, 724, 710, 514
See application file for complete search history.

(56) References Cited

U.S. PATENT DOCUMENTS 5,935,873 A    8/1999  Spuler et al.
6,078,073 A *  6/2000  Habu et al. .................. 257/296
6,562,651 B2   5/2003  Chung et al.
2002/0065023 A1  5/2002  Kwok
2003/0080395 A1  5/2003  Beasom
2004/0126951 A1* 7/2004  Lee ........................... 438/200
2005/0136683 A1* 6/2005  Lee et al. .................... 438/737

FOREIGN PATENT DOCUMENTS

KR    2000-0015113    3/2000
KR    10-2005-0063851  6/2005

* cited by examiner

*Primary Examiner*—Chuong Anh Luu
(74) *Attorney, Agent, or Firm*—Blakely Sokoloff Taylor & Zafman

(57) ABSTRACT

A method for fabricating a semiconductor device is capable of preventing a hard mask layer of a conductive structure from being damaged during a self-aligned contact etching process. The method includes the steps of: forming a plurality of conductive structures including a conductive layer and a hard mask layer on a substrate; sequentially forming a first nitride layer, an oxide layer, a second nitride layer, and an etch stop layer on the plurality of conductive structures; forming an inter-layer insulation layer on the etch stop layer; and performing a self-aligned contact (SAC) etching process selectively etching the inter-layer insulation layer, the etch stop layer, the second nitride layer and the oxide layer until the SAC etching process is stopped at the first nitride layer to thereby form a contact hole exposing the first nitride layer.

14 Claims, 9 Drawing Sheets

METHOD AND FABRICATING SEMICONDUCTOR DEVICE

FIELD OF THE INVENTION

The present invention relates to a method for fabricating a semiconductor device; and, more particularly, to a method for fabricating a semiconductor device capable of preventing loss of a hard mask of a conductive structure during a contact formation.

DESCRIPTION OF RELATED ARTS

A trend of large-scale of integration has brought a need to form semiconductor devices densely within a confined cell region. Thus, sizes of unit devices of a semiconductor device, for instance, transistors and capacitors, have been gradually decreased. Particularly, in a dynamic random access memory (DRAM) device, sizes of the unit devices formed within a cell region have been decreased as the design rule has been shifted towards minimization. For instance, DRAM devices are currently formed to have a minimum linewidth less than about 0.1 μm and are often required to have a linewidth less than about 80 nm. Hence, there exist many difficulties in applying conventional fabrication methods.

In case of applying a photolithography using a light source of ArF having a wavelength of 193 nm to a semiconductor device having a linewidth less than about 80 nm, it is necessary to develop an additional process recipe for preventing a photoresist deformation created during an etching process employed for the purpose of precisely forming a pattern and a vertical etch profile.

Meanwhile, advancement in the integration level of semiconductor devices has led device elements to-be formed in stacks. A contact plug or a pad is one example of the stack structure.

For the contact plug, a landing plug contact (LPC) is commonly formed since the LPC has a bottom portion which makes a wide contact within a minimum area and a top portion which is wider than the bottom portion to increase a contact margin.

A self-aligned contact (SAC) etching process is adopted to form a LPC between structures having a high aspect ratio. The SAC etching process is a method of forming a contact by carrying out an etching process to a bottom structure having a specific etch selectivity ratio. Generally, the SAC etching process uses different etch selectivity ratios between nitride and oxide.

Generally, the SAC etching process uses an etch gas selected from families of CF and CHF. Also, it is required to form nitride layers for forming an etch stop layer and a spacer to prevent bottom conductive structures from being damaged.

For instance, in case of a gate electrode, a nitride-based spacer is formed on the top and sidewalls of the gate electrode. Because of an increased aspect ratio, the spacer is formed in stacks of nitride layers. A buffer oxide layer is formed between these nitride layers in order to suppress generation of cracks caused by a stress induced between the nitride layers or between the nitride layer and a substrate. A typical example of such spacer is a triple stack structure of a nitride layer, an oxide layer and a nitride layer. This triple stack structure is called NON structure.

In addition, an etch stop layer made of nitride is formed on the NON structure in order to prevent conductive structures from being damaged during a cell contact formation process.

Hereinafter, a conventional method for forming a cell contact with use of the above-described gate electrode structure having the NON structure and the etch stop layer will be described.

FIGS. 1A to 1D are cross-sectional views illustrating a conventional method for forming a cell contact.

Figure 1A:
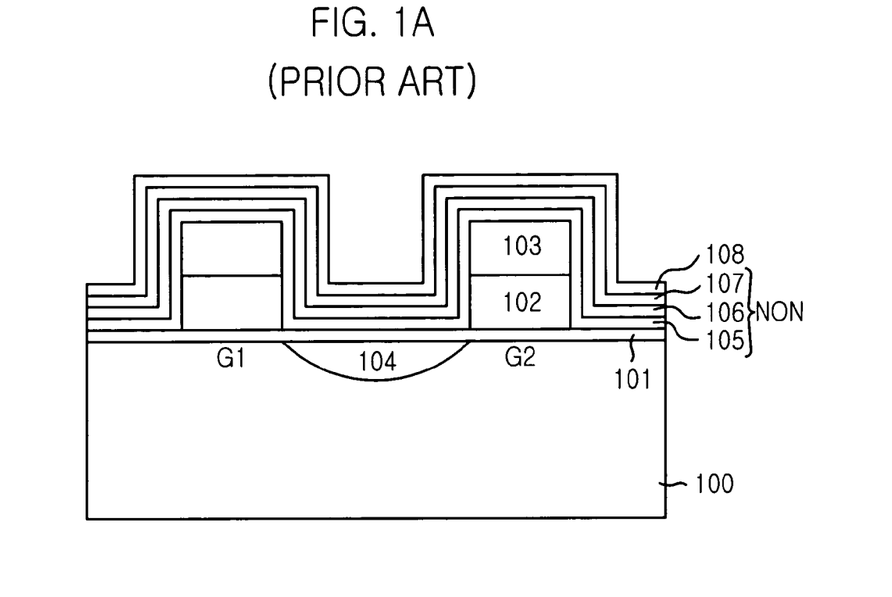
FIGS. 1A to 1D are cross-sectional views illustrating a conventional method for forming a cell contact.

Referring to FIG. 1A, a plurality of gate electrode structures G1 and G2 are formed on a substrate 100. Each of the gate electrode structures includes a gate hard mask 103, a gate conductive layer 102 and a gate insulation layer 101.

The gate insulation layer 101 is made of a typical oxide-based material such as silicon oxide, while the gate conductive layer 102 is made of a material selected in single or in combination from a group of polysilicon, tungsten (W), tungsten nitride (WN), and tungsten silicide ($WSi_x$).

The gate hard mask 103 is a protective layer for the gate conductive layer 102 in the course of forming a contact hole by etching an inter-layer insulation layer which will be subsequently formed. Thus, the gate hard mask 103 is made of a material having a significantly different etch selectivity ratio from the inter-layer insulation layer. For instance, if the inter-layer insulation layer is made of an oxide-based material, the gate hard mask 103 is made of a nitride-based material such as silicon nitride (SiN) or silicon oxynitride (SiON). If the inter-layer insulation layer is made of a polymer-based low dielectric material, the gate hard mask 103 is made of an oxide-based material.

Also, an impurity diffusion region 104 such like a source/drain junction is formed in a predetermined portion of the substrate 100 disposed between the gate electrode structures G1 and G2.

After the formation of the plurality of gate electrode structures G1 and G2, a sealing nitride layer 105, a buffer oxide layer 106 and a spacer nitride layer 107 are sequentially formed on the gate electrode patterns G1 and G2. Herein, a reference denotation NON expresses an NON structure including the sealing nitride layer 105, the buffer oxide layer 106 and the spacer nitride layer 107.

Next, an etch stop layer 108 is formed on the spacer nitride layer 107 in order to stop an etching and thus to prevent bottom semiconductor structures such as the gate electrode structures G1 and G2 from being damaged during a SAC etching process. At this time, the etch stop layer 108 is preferably formed along a profile of the spacer nitride layer 107 and is made of a nitride-based material.

Figure 1B:
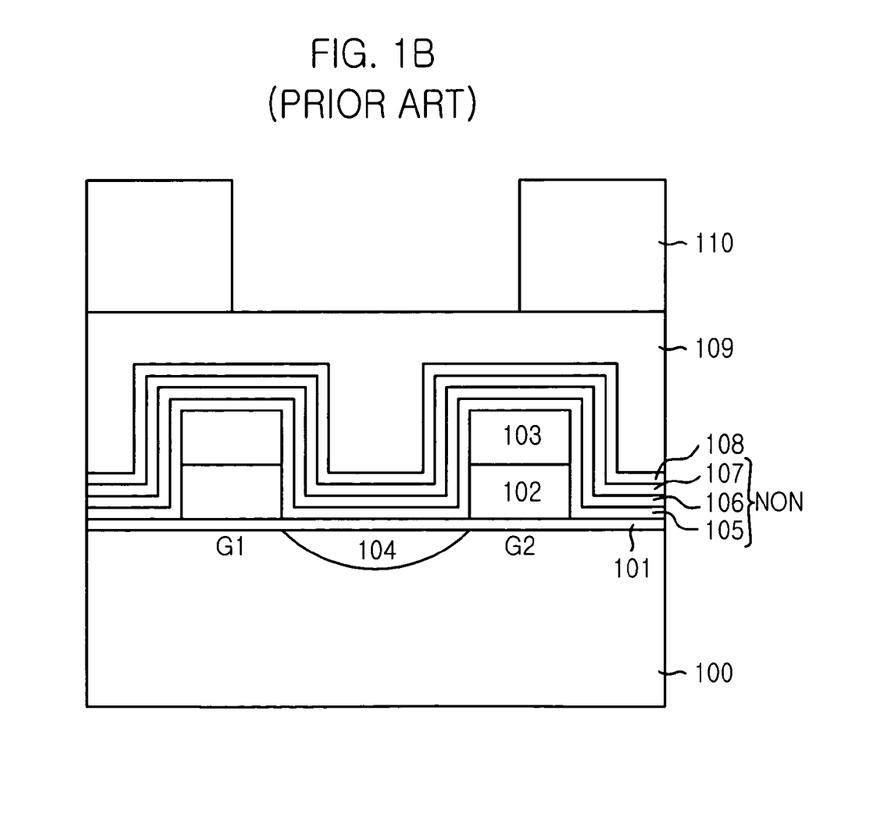

Referring to FIG. 1B, an inter-layer insulation layer 109 which is made of an oxide-based material is formed on the etch stop layer 108. Examples of the oxide-based material are borosilicate glass (BSG), borophosphosilicate glass (BPSG), phosphosilicate glass (PSG), tetraethylorthosilicate (TEOS), high density plasma (HDP) oxide, spin on glass (SOG), advanced planarization layer (APL) and the like. In addition to the oxide-based materials, the inter-layer insulation layer 109 can be made of an organic or inorganic low dielectric material.

A photoresist pattern 110 for forming a cell contact is formed on the inter-layer insulation layer 109. Although not illustrated, it is possible to form an anti-reflective coating layer between the photoresist pattern 110 and the inter-layer insulation layer 109.

Figure 1C:
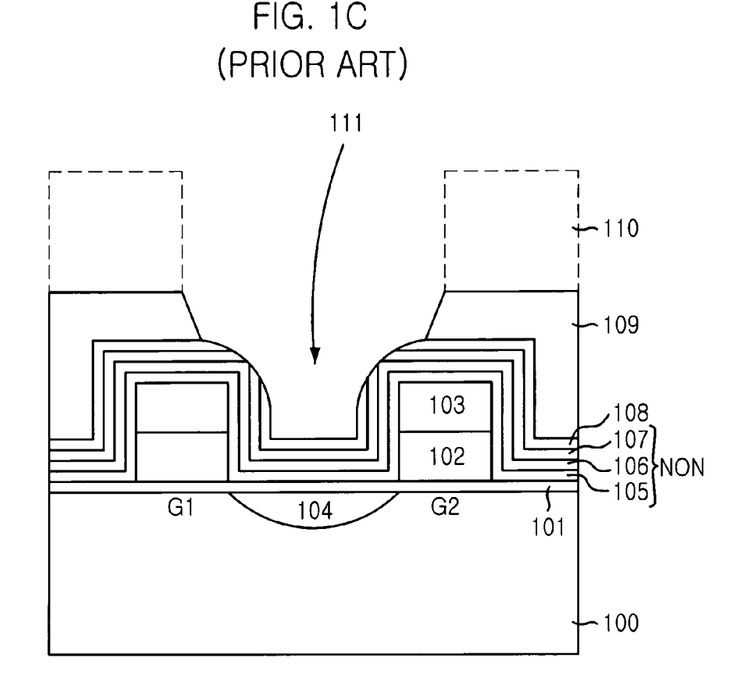

Referring to FIG. 1C, the inter-layer insulation layer 109 is etched by performing a SAC etching process with use of the photoresist pattern 110 as an etch mask. At this time, the SAC etching process proceeds under the use of different etch selectivity ratios between the inter-layer insulation layer 109 and the gate hard mask 103. Also, this SAC etching process stops at the etch stop layer 108. From this SAC etching process, a contact hole 111 is formed. Thereafter, the photoresist pattern 110 is removed through an ashing process. If the anti-reflective coating layer is made of an organic material, the anti-reflective coating layer is also simultaneously removed during this ashing process.

Figure 1D:
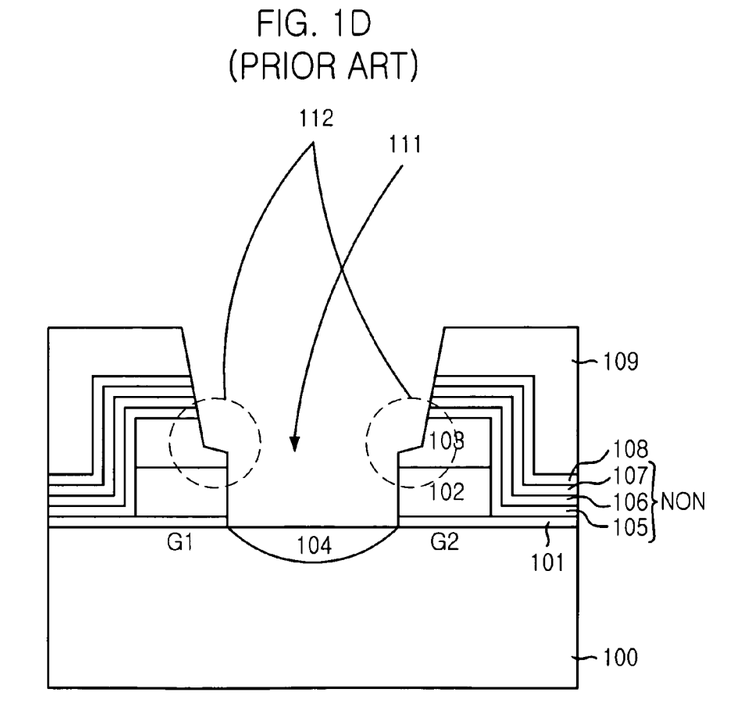

Referring to FIG. 1D, a contact opening process is performed to expose the impurity diffusion region 104 disposed beneath a bottom of the contact hole 111 by removing the etch stop layer 108, the NON structure and the gate insulation layer 101. Then, a cleaning process for removing etch remnants and extending an opening of the contact hole 111 is performed.

For the SAC etching process and the contact opening process, a combined gas of $C_xF_y$, where x and y representing atomic ratios range from 1 to 10, and $C_aH_bF_c$, where a, b and c representing atomic ratios range from 1 to 10, is used.

Although not illustrated, after the cleaning process, a conducting material for forming a plug is filled into the contact hole 111. Then, a chemical mechanical polishing (CMP) process is performed under a target of exposing a surface of the gate hard mask 103, so that a plug electrically connected to the impurity diffusion region 104 through the contact hole 111 is formed.

Meanwhile, because of the large-scale of integration, heights of the gate electrode structures G1 and G2 become augmented. Thus, a thickness of an etch target increases, inevitably resulting in overuse of an etch gas and an elongated etch time. As a result, the gate hard mask 103 is lost as denoted with the reference numeral 112 in FIG. 1D.

The loss of the gate hard mask 103 has a great impact on device operations. For instance, if the gate hard mask 103 which will be flowed in a subsequent process remains in small amounts, there arises a short between devices due to a failure of the self-aligned contact. Therefore, one important purpose of the cell contact formation process is to minimize the loss of the gate hard mask 103.

Particularly, among various processes causing the loss of the gate hard mask 103, the removal of the etch stop layer 108, the NON structure and the gate insulation layer 101 is the most difficult process to minimize the loss of the gate hard mask 103. Since a blanket etch-back process is applied under a target of over-etching the etch stop layer 108, the NON structure and the gate insulation layer 101 for securing a sufficient contact hole opening, it is difficult to minimize the loss of the gate hard mask 103.

For instance, in a device having a linewidth less than 80 nm, a remaining etch stop layer 108 has a thickness of 250 Å. Under consideration of the over-etch, it is expected that a thickness of the lost gate hard mask 103 is 400 Å. However, the use of a capping layer made of undoped silicate glass (USG) can compensate the loss of the gate hard mask 103 up to 200 Å.

However, it is nearly impossible to apply this capping layer to a device having a linewidth of 60 nm since there may be a problem of a failure in opening a contact.

SUMMARY OF THE INVENTION

It is, therefore, an object of the present invention to provide a method for fabricating a semiconductor device capable of preventing a hard mask of a conductive structure from being damaged during a contact formation process.

In accordance with an aspect of the present invention, there is provided a method for fabricating a semiconductor device, including the steps of: forming a plurality of conductive structures including a conductive layer and a hard mask layer on a substrate; sequentially forming a first nitride layer, an oxide layer, a second nitride layer, and an etch stop layer on the plurality of conductive structures; forming an inter-layer insulation layer on the etch stop layer; and performing a self-aligned contact (SAC) etching process selectively etching the inter-layer insulation layer, the etch stop layer, the second nitride layer and the oxide layer until the SAC etching process is stopped at the first nitride layer to thereby form a contact hole exposing the first nitride layer.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A method for fabricating a semiconductor device in accordance with a preferred embodiment of the present invention will be described in detail with reference to the accompanying drawings, which is set forth hereinafter.

Figure 2:
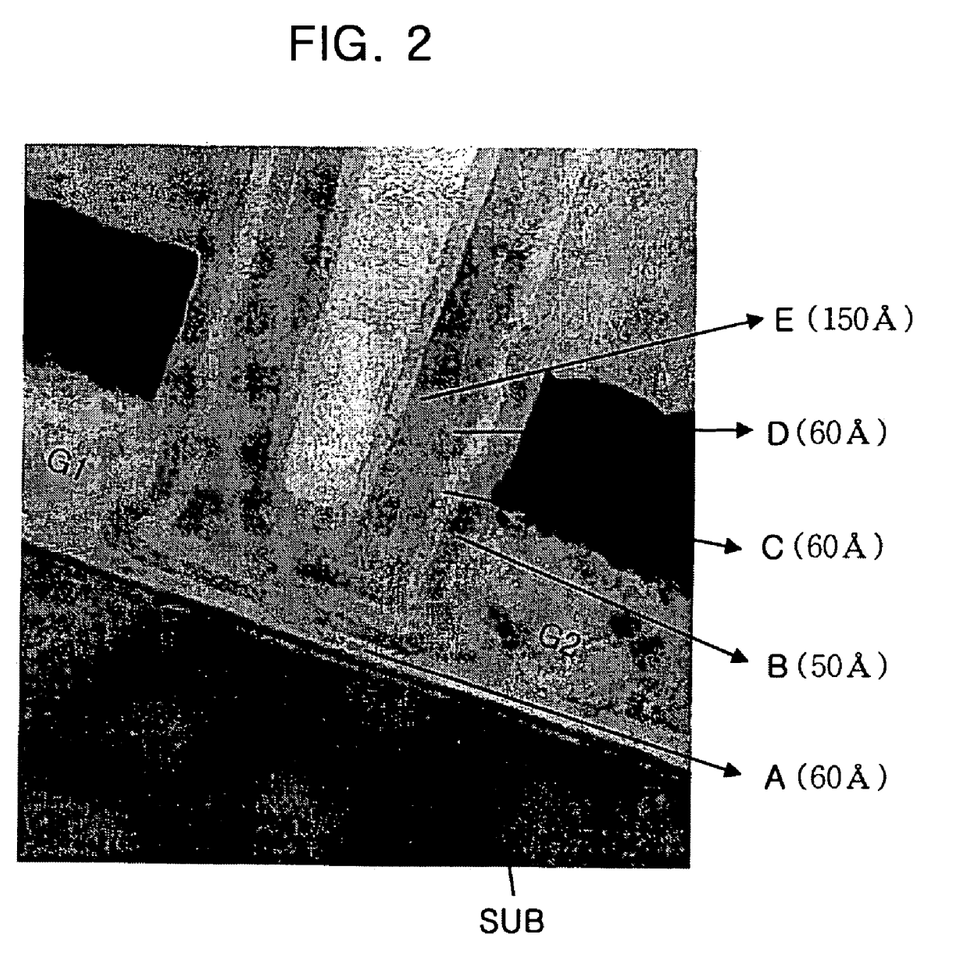
FIG. 2 is a picture of scanning electron microscopy showing a gate electrode structure having an NON structure of a nitride layer, an oxide layer and a nitride layer.

FIG. 2 is a picture of scanning electron microscopy showing a gate electrode structure with an NON structure of a nitride layer, an oxide layer and a nitride layer.

As shown, a first nitride layer B, an oxide layer C, a second nitride layer D and an etch stop layer E are sequentially formed on gate electrode structures G1 and G2. Also, a gate oxide layer A is formed on an interface between each of the gate electrode structures G1 and G2 and a substrate SUB.

At this time, the gate oxide layer A, the first nitride layer B, the oxide layer C, the second nitride layer D, and the etch stop layer E have a thickness of approximately 60 Å, approximately 70 Å, approximately 80 Å, approximately 90 Å and 100 Å, respectively. Therefore, a total thickness that is to be removed by a blanket etch-back process for opening a contact hole is approximately 400 Å.

In a conventional method, a self-aligned contact (SAC) etching process for forming a contact is stopped at the etch stop layer E and the second nitride layer D. In a dipole ring magent (DRM) device, which is a SAC etching device for etching an oxide layer, a thickness of the second nitride layer D is greater than approximately 200 Å since a thickness of a lost portion of the second nitride layer D is approximately 200 Å. However, in a recently developed device, a thickness of the lost portion of the second nitride layer D is approximately 80 Å during an etching of the oxide layer C because of advancement in an etching device and development of enhanced etch gases. Thus, it is possible to control uniformity of a substrate structure.

FIGS. 3A to 3E are cross-sectional views illustrating a method for forming a contact in accordance with a preferred embodiment of the present invention.

Figure 3A:
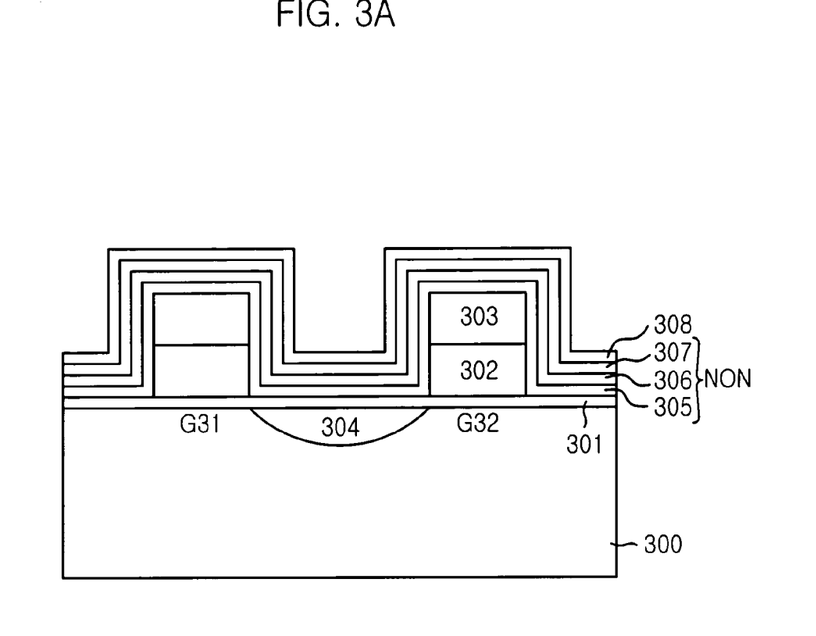
FIGS. 3A to 3E are cross-sectional views illustrating a method for forming a contact in accordance with a preferred embodiment of the present invention.

Referring to FIG. 3A, a plurality of gate electrode structures G31 and G32 are formed on a substrate 300. Herein, each of the gate electrode structure G31 and G32 includes a gate hard mask 303, a gate conductive layer 302 and a gate insulation layer 301.

The gate insulation layer 301 is made of a typical oxide-based material such as silicon oxide, while the gate conductive layer 302 is made of a material selected singly or in combination from a group consisting of polysilicon, tungsten (W), tungsten nitride (WN) and tungsten nitride ($WSi_x$).

The gate hard mask 303 serves a role in protecting the gate conductive layer 302 in the course of forming a contact hole by etching an inter-layer insulation layer which will be subsequently formed. Thus, the gate hard mask 303 is made of a material having a different etch selectivity from the inter-layer insulation layer. For instance, if the inter-layer insulation layer is made of an oxide-based material, the gate hard mask 303 is made of a nitride-based material such as silicon nitride or silicon oxynitride (SiON). If the inter-layer insulation layer is made of a polymer-based low dielectric material, the gate hard mask 303 is made of an oxide-based material.

There is an impurity diffusion region 304 such as a source/drain junction in a predetermined portion of the substrate 300 disposed between the gate electrode structures G31 and G32.

After the formation of the gate electrode structures G31 and G32, a first nitride layer 305, an oxide layer 306 and a second nitride layer 307 are sequentially formed on the gate electrode structures G31 and G32. Herein, the first nitride layer 305, the oxide layer 306 and the second nitride layer 307 form a structure of nitride, oxide and nitride (NON). This NON structure is expressed with a reference denotation of NON.

Then, an etch stop layer 308 for stopping a SAC etching is formed on the second nitride layer 307 so as to prevent the gate electrode structures G31 and G32 from being damaged during a subsequent SAC etching process. At this time, the etch stop layer 308 is preferably formed along a profile of the second nitride layer 307 and is made of a nitride-based material.

Herein, the second nitride layer 307 is formed to have a thickness of approximately 70 Å so as to be easily perforated by the SAC etching process. At this time, changes in characteristics of a transistor caused by the thinned second nitride layer 307 are minimized by controlling ion implantation recipes and thicknesses of the oxide layer 306 and the first nitride layer 305. Especially, the first nitride layer 305 has a thickness of approximately 80 Å.

That is, the second nitride layer 307 has a thickness in a range from approximately 70 Å to approximately 150 Å, while the first nitride layer 305 has a thickness in a range from approximately 80 Å to approximately 120 Å.

Figure 3B:
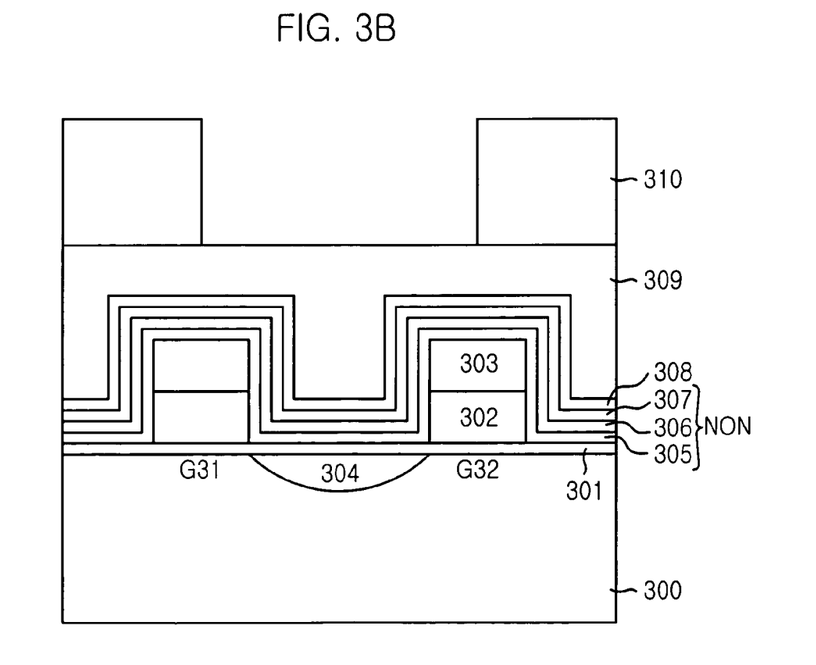

Referring to FIG. 3B, the aforementioned inter-layer insulation layer 309 made of an oxide-based material is formed on the etch stop layer 308. Examples of the oxide-based material are borosilicate glass (BSG), borophosphosilicate glass (BPSG), phosphosilicate glass (PSG), tetraethylorthosilicate (TEOS), high density plasma (HDP) oxide, spin on glass (SOG) and advanced planarization layer (APL). In addition to the use of the oxide-based material, the inter-layer insulation layer 309 can be made of an organic or inorganic low dielectric material.

Next, a photoresist pattern 310 for forming a contact is formed on the inter-layer insulation layer 309. It is also possible to form an anti-reflective coating layer between the photoresist pattern 310 and the inter-layer insulation layer 309.

Figure 3C:
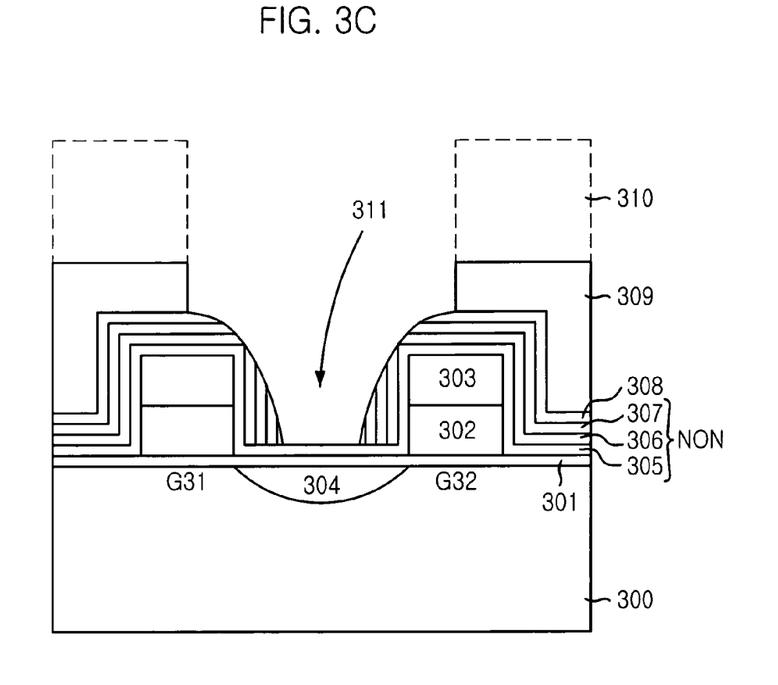

Referring to FIG. 3C, a SAC etching process is performed to etch the inter-layer insulation layer 309 with use of the photoresist pattern 310 as an etch mask, so that a contact hole 311 exposing the first nitride layer 305 disposed between the gate electrode structures G31 and G32 is formed.

At this time, the SAC etching process is carried out until the second nitride layer 307 is perforated. Because of this perforated second nitride layer 307, the oxide layer 306 is almost removed by the SAC etching process. The SAC etching process stops at the first nitride layer 305.

Also, the SAC etching process uses a main etch gas selected from a group of fluorine-based plasma $C_xF_y$ such as $C_2F_4$, $C_2F_6$, $C_3F_8$, $C_4F_6$, $C_5F_8$ and $C_5F_{10}$. Herein, values of the subscripts x and y representing atomic ratios are in a range from approximately 1 to approximately 10. A gas for generating a polymer during the SAC etching process, e.g., $CH_2F_2$, $C_3HF_5$ or $CHF_3$, is added to the main etch gas along with a carrier gas selected from an inert gas group consisting of He, Ne, Ar and Xe.

The remaining portions of the etch stop layer 308, the second nitride layer 307 and the oxide layer 306 disposed on a sidewall of each of the gate electrode patterns G31 and G32 in which the contact hole 311 is formed are removed, and the photoresist pattern 310 is then removed by employing a photoresist stripping process.

Figure 3D:
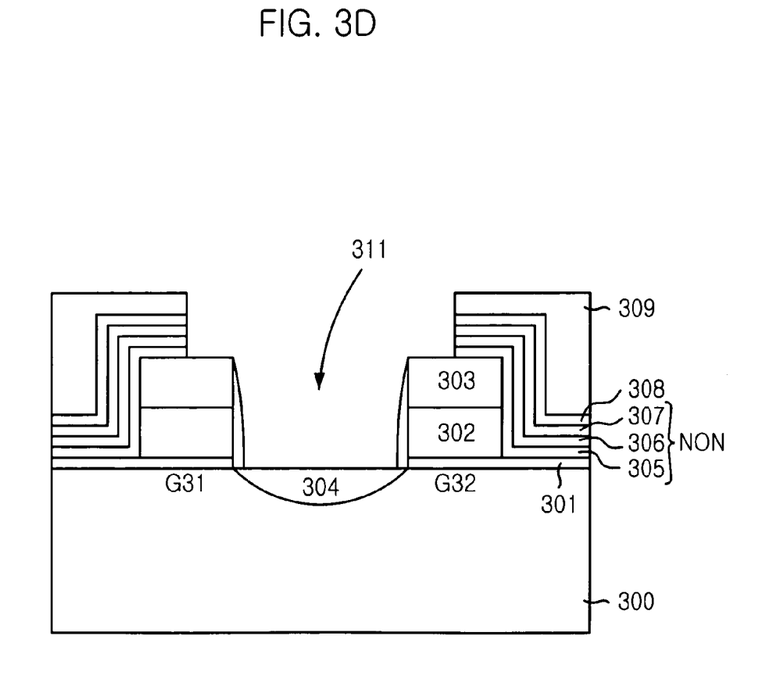

Referring to FIG. 3D, a blanket etch-back process is performed to open a top of the impurity diffusion region 304 by removing the first nitride layer 305 and the gate insulation layer 301. After the blanket etch-back process, the impurity diffusion region 304 is exposed. This step is called a contact hole opening process. Also, the first oxide layer 305 disposed on lateral sides of the contact hole 311 becomes a spacer of each gate electrode pattern G31 or G32.

Meanwhile, compared to the convention method in which the etch stop layer 308, the NON structure and the gate insulation layer 301 are removed during the contact hole opening process, a thickness of the etch target in accordance with the preferred embodiment of the present invention is decreased since only the first nitride layer 305 and the gate insulation layer 301 need to be removed. As a result of this decreased etch target, it is possible to minimize losses of the gate hard mask 303.

After the contact hole opening process, a wet cleaning process is carried out with use of a cleaning solution to secure a critical dimension (CD) of the bottom of the contact hole 311 and remove etch remnants remaining after the SAC etching process and the blanket etch-back process. Particularly, buffer oxide etchant (BOE) and hydrogen fluoric (HF) acid are examples of the cleaning solution for the wet cleaning process. In case of HF acid, it is preferable to use a diluted solution of HF obtained by mixing HF with water in a ratio of approximately 50 to approximately 500 parts of water to approximately 1 part of HF.

Figure 3E:
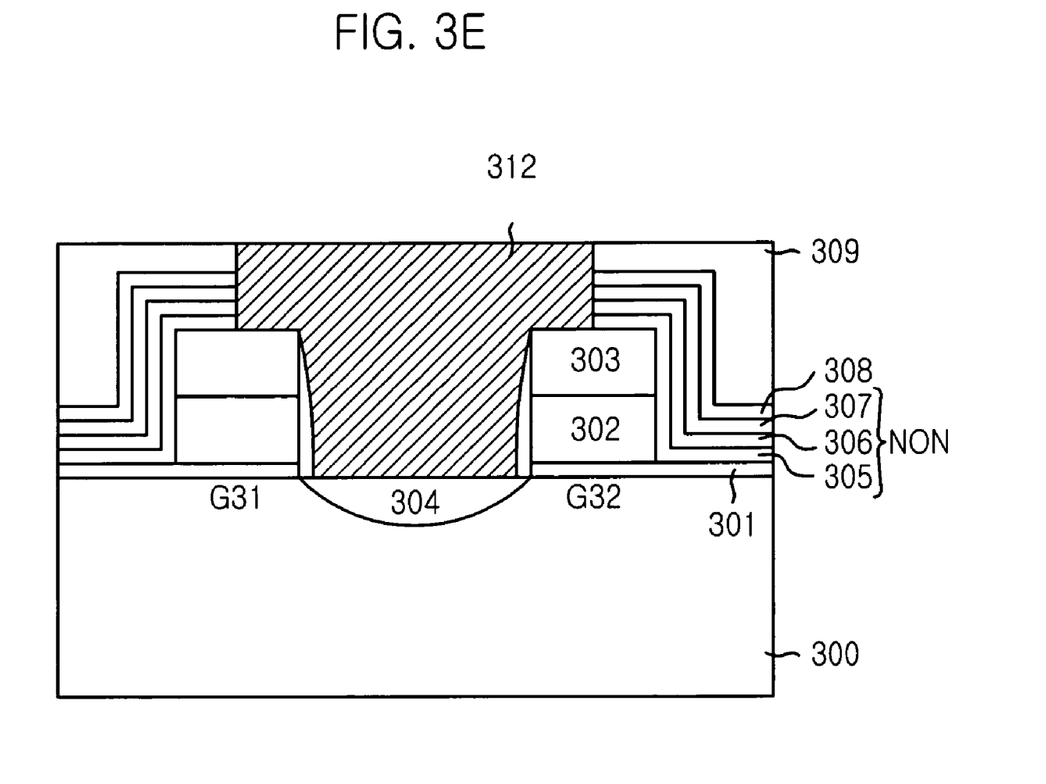

Referring to FIG. 3E, a conducting material for forming a plug is filled into the contact hole 311. Herein, the conducting material is typically polysilicon, and it is also possible to use the conducting material obtained by stacking polysilicon and a barrier metal such as titanium (Ti) and titanium nitride (TiN). In addition to polysilicon, tungsten can be also used as the conducting material.

Subsequent to the formation of the conducting material, a chemical mechanical polishing (CMP) process or a blanket etch-back process is performed to form a plug 312 for making an electric contact to the substrate 300 through the contact hole 311. At this time, the CMP process or the blanket etch-back process proceeds until a surface of the gate hard mask 303 is exposed. However, it is also possible to proceed with the CMP process or the blanket etch-back process under a target that the inter-layer insulation layer 309 partially remains.

FIGS. 4A to 4F are cross-sectional views illustrating a method for forming a contact in accordance with a preferred embodiment of the present invention. Herein, the same reference numerals used in FIGS. 3A to 3E are used for the same constitution elements.

Figure 4A:
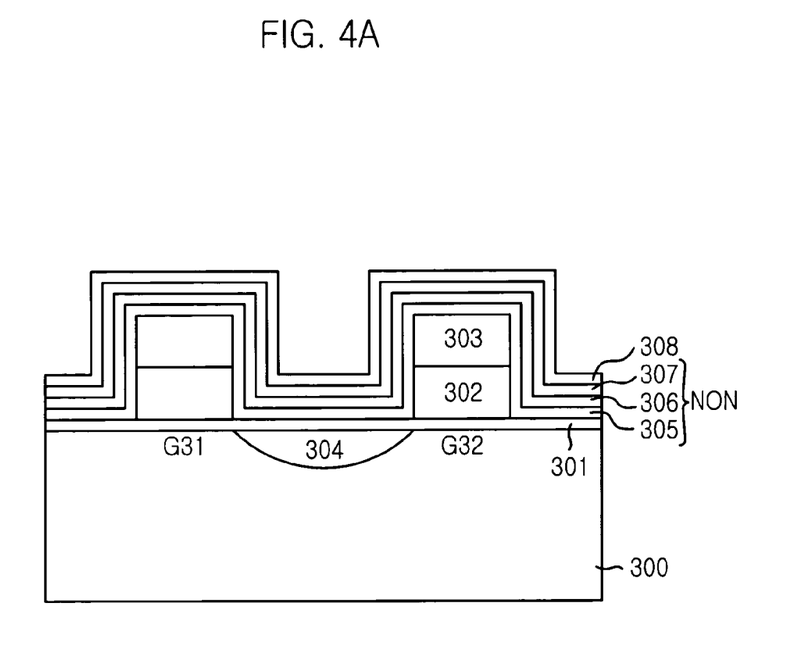
FIGS. 4A to 4F are cross-sectional views illustrating a method for forming a contact in accordance with another preferred embodiment of the present invention.

Referring to FIG. 4A, a plurality of gate electrode structures G31 and G32 are formed on a substrate 300. Herein, each of the gate electrode structure G31 and G32 includes a gate hard mask 303, a gate conductive layer 302 and a gate insulation layer 301.

The gate insulation layer 301 is made of a typical oxide-based material such as silicon oxide, while the gate conductive layer 302 is made of a material selected singly or in combination from a group consisting of polysilicon, tungsten (W), tungsten nitride (WN) and tungsten nitride (WSi$_x$).

The gate hard mask 303 serves a role in protecting the gate conductive layer 302 in the course of forming a contact hole by etching an inter-layer insulation layer which will be subsequently formed. Thus, the gate hard mask 303 is made of a material having a different etch selectivity from the inter-layer insulation layer. For instance, if the inter-layer insulation layer is made of an oxide-based material, the gate hard mask 303 is made of a nitride-based material such as silicon nitride or silicon oxynitride (SiON). If the inter-layer insulation layer is made of a polymer-based low dielectric material, the gate hard mask 303 is made of an oxide-based material.

There is an impurity diffusion region 304 such as a source/drain junction in a predetermined portion of the substrate 300 disposed between the gate electrode structures G31 and G32.

After the formation of the gate electrode structures G31 and G32, a first nitride layer 305, an oxide layer 306 and a second nitride layer 307 are sequentially formed on the gate electrode structures G31 and G32. Herein, the first nitride layer 305, the oxide layer 306 and the second nitride layer 307 form a structure of nitride, oxide and nitride (NON). This NON structure is expressed with a reference denotation of NON.

Then, an etch stop layer 308 for stopping a SAC etching is formed on the second nitride layer 307 so as to prevent the gate electrode structures G31 and G32 from being damaged during a subsequent SAC etching process. At this time, the etch stop layer 308 is preferably formed along a profile of the second nitride layer 307 and is made of a nitride-based material.

Herein, the second nitride layer 307 is formed to have a thickness of approximately 70 Å so as to be easily perforated by the SAC etching process. At this time, changes in characteristics of a transistor caused by the thinned second nitride layer 307 are minimized by controlling ion implantation recipes and thicknesses of the oxide layer 306 and the first nitride layer 305. Especially, the first nitride layer 305 has a thickness of approximately 80 Å.

That is, the second nitride layer 307 has a thickness in a range from approximately 70 Å to approximately 150 Å, while the first nitride layer 305 has a thickness in a range from approximately 80 Å to approximately 120 Å.

Figure 4B:
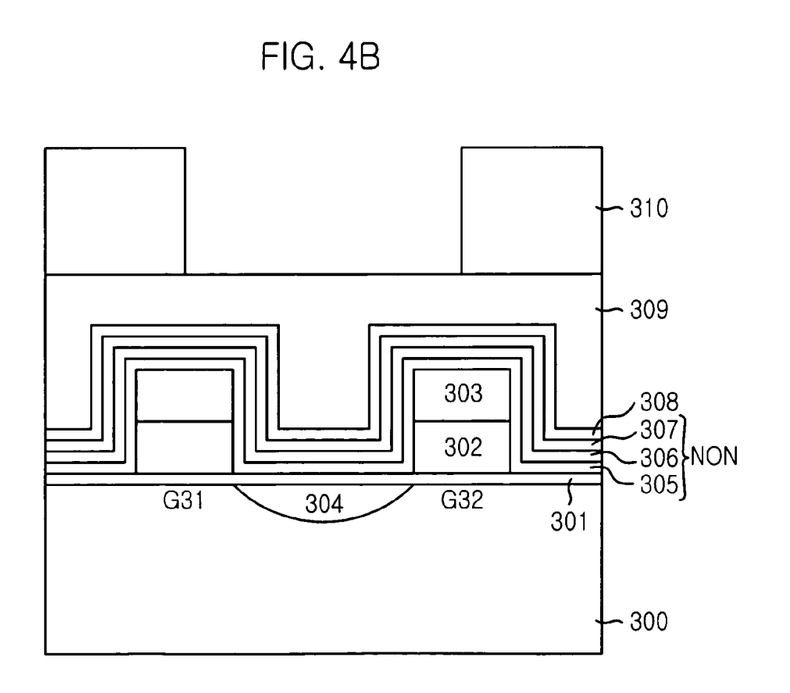

Referring to FIG. 4B, the aforementioned inter-layer insulation layer 309 made of an oxide-based material is formed on the etch stop layer 308. Examples of the oxide-based material are borosilicate glass (BSG), borophosphosilicate glass (BPSG), phosphosilicate glass (PSG), tetra-ethylorthosilicate (TEOS), high density plasma (HDP) oxide, spin on glass (SOG) and advanced planarization layer (APL). In addition to the use of the oxide-based material, the inter-layer insulation layer 309 can be made of an organic or inorganic low dielectric material.

Next, a photoresist pattern 310 for forming a contact is formed on the inter-layer insulation layer 309. It is also possible to form an anti-reflective coating layer between the photoresist pattern 310 and the inter-layer insulation layer 309. Also, a hard mask can be used in addition to the use of the photoresist pattern 310 as a mask, or a hard mask can be solely used. That is, it is possible to use a sacrificial hard mask made of a material such as tungsten, polysilicon, or nitride in order to secure tolerance of the photoresist pattern to an etching process and prevent a pattern deformation phenomenon. In addition, the etch mask used for forming subsequent contact holes, i.e., the photoresist pattern 310 in this preferred embodiment, can be formed in T-type, hole type or bar type.

Figure 4C:
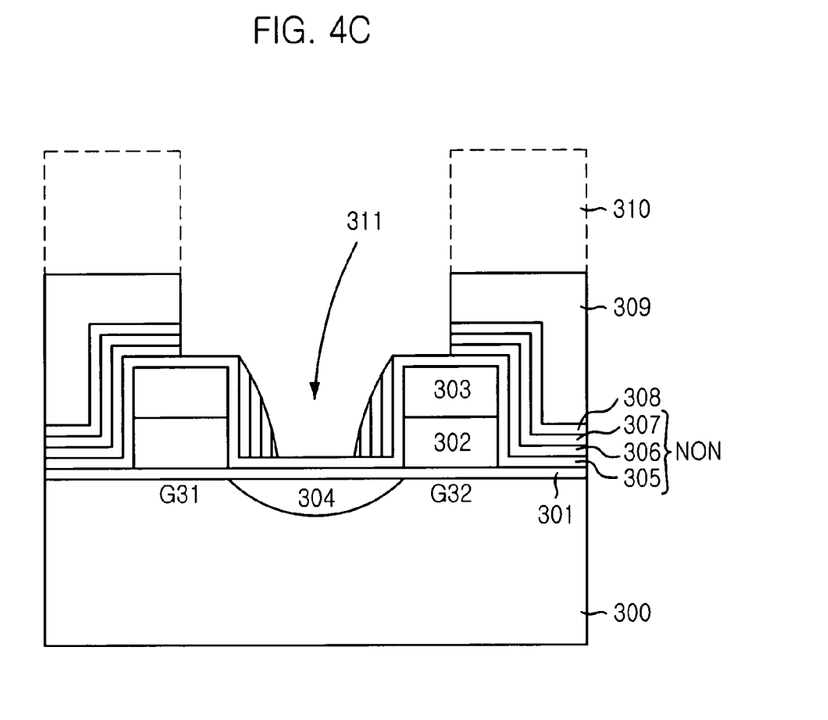

Referring to FIG. 4C, a SAC etching process is performed to etch the inter-layer insulation layer 309 with use of the photoresist pattern 310 as an etch mask, so that a contact hole 311 exposing the first nitride layer 305 disposed between the gate electrode structures G31 and G32 is formed.

At this time, the SAC etching process is carried out until the second nitride layer 307 is perforated. Because of this perforated second nitride layer 307, the oxide layer 306 is almost removed by the SAC etching process and the first nitride layer 305 is partially etched. The SAC etching process stops at the first nitride layer 305.

Also, the SAC etching process uses a main etch gas selected from a group of fluorine-based plasma $C_xF_y$ such as $C_2F_4$, $C_2F_6$, $C_3F_8$, $C_4F_6$, $C_5F_8$ and $C_5F_{10}$. Herein, values of the subscripts x and y representing atomic ratios are in a range from approximately 1 to approximately 10. A gas for generating a polymer during the SAC etching process, e.g., $CH_2F_2$, $C_3HF_5$ or $CHF_3$, is added to the main etch gas along with a carrier gas selected from an inert gas group consisting of He, Ne, Ar and Xe.

After the SAC etching process, remaining portions of the etch stop layer 308, the second nitride layer 307 and the oxide layer 306 are removed, and the photoresist patter 310 is then removed by employing a photoresist stripping process. If the sacrificial hard mask is used, it is possible to omit the step of removing the hard mask.

Figure 4D:
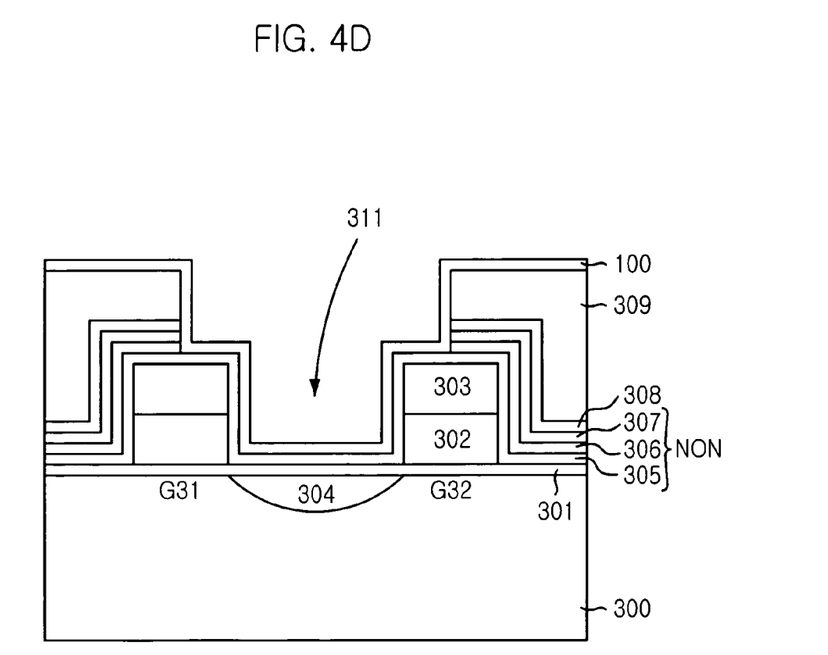

Referring to FIG. 4D, an attack barrier layer 100 is formed on the above resulting substrate structure. Herein, the attack barrier layer 100 serves a role in preventing deterioration of an insulation characteristic of the inter-layer insulation layer 309 and is preferably formed in a thickness of approximately 50 Å. At this time, the attack barrier layer 100 is preferably made of nitride having a thickness ranging from approximately 30 Å to approximately 150 Å.

Figure 4E:
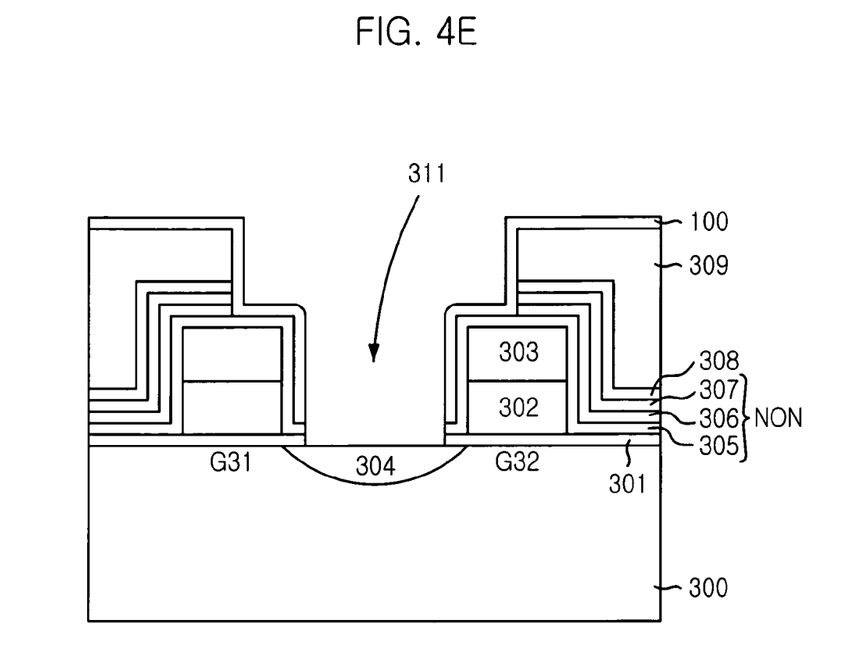

Referring to FIG. 4E, a blanket etch-back process or a wet cleaning process is performed to expose the impurity diffusion region 304 by removing the attack barrier layer 100, the first nitride layer 305 and the gate insulation layer 301. This step is called a contact hole opening process.

Meanwhile, compared to the convention method in which the etch stop layer 308, the NON structure and the gate insulation layer 301 are removed during the contact hole opening process, a thickness of the etch target in accordance with the preferred embodiment of the present invention is decreased since only the attack barrier layer 100, the first nitride layer 305 and the gate insulation layer 301 need to be removed. As a result of this decreased etch target, it is possible to minimize loss of the gate hard mask 303.

After the contact hole opening process, a wet cleaning process is carried out with use of a cleaning solution to secure a critical dimension (CD) of the bottom of the contact hole 311 and remove etch remnants remaining after the SAC etching process and the blanket etch-back process. Particularly, buffer oxide etchant (BOE) and hydrogen fluoric (HF) acid are examples of the cleaning solution for the wet cleaning process. In case of HF acid, it is preferable to use a diluted solution of HF obtained by mixing HF with water in a ratio of approximately 50 parts to approximately 500 parts of water to approximately 1 part of HF. During the wet cleaning process, the inter-layer insulation layer 309 is not damaged because of the attack barrier layer 100.

Figure 4F:
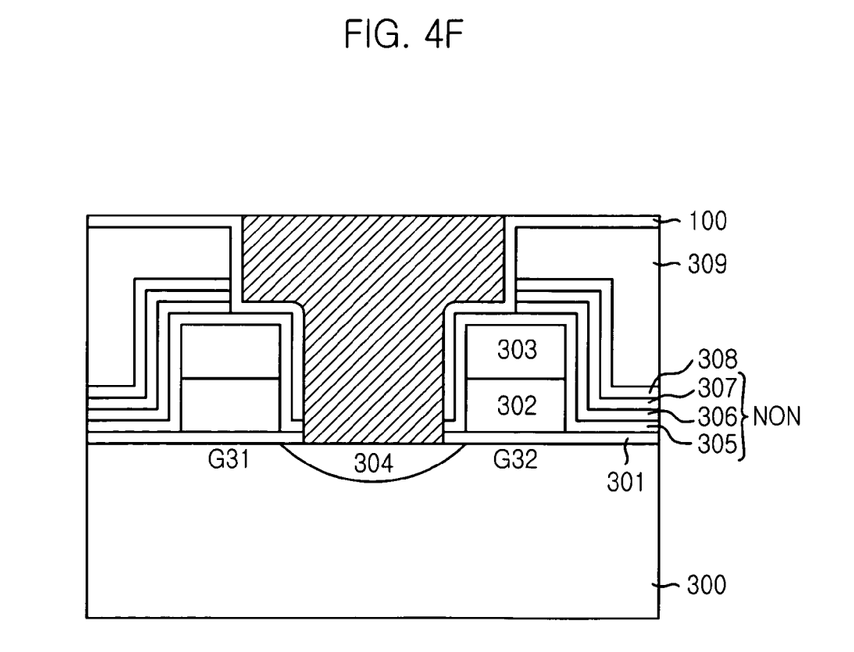

Referring to FIG. 4F, a conducting material for forming a plug is filled into the contact hole 311. Herein, the conducting material is typically polysilicon, and it is also possible to use the conducting material obtained by stacking polysilicon and a barrier metal such as titanium (Ti) and titanium nitride (TiN). In addition to polysilicon, tungsten can be also used as the conducting material.

Subsequent to the formation of the conducting material, a chemical mechanical polishing (CMP) process or a blanket etch-back process is performed to form a plug 312 for making an electric contact to the substrate 300 through the contact hole 311. At this time, the CMP process or the blanket etch-back process proceeds until a surface of the gate hard mask 303 is exposed. However, it is also possible to proceed with the CMP process or the blanket etch-back process under a target that the inter-layer insulation layer 309 partially remains.

In accordance with the preferred embodiments of the present invention, a thickness of the etch target for the blanket etch-back process for achieving a contact opening is decreased, thereby preventing the gate hard mask of the gate electrode structure from being damaged during the SAC etching process. Accordingly, it is further possible to increase yields of semiconductor devices.

Although the preferred embodiments of the present invention exemplifies the case of forming a plug for making a cell contact, this type of plug can be applied for a bit line contact and a storage node contact. Therefore, in case of forming a plug for a storage node contact, the impurity diffusion region is replaced with a cell contact plug or a contact pad, while the gate electrode structure is replaced with a bit line.

Also, it is possible to apply these preferred embodiments to other contact formation processes that make a bottom portion of the conductive structure exposed. One example of such contact formation process is a process for forming a metal wire contact.

The present application contains subject matter related to the Korean patent application Nos. KR 2003-0094511 and KR 2004-0041516, filed in the Korean Patent Office respectively on Dec. 22, 2003 and on Jun. 7, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising the steps of:
   forming a plurality of conductive structures including a conductive layer and a hard mask layer on a substrate;
   sequentially forming a first nitride layer, an oxide layer, a second nitride layer, and an etch stop layer on the plurality of conductive structures;
   forming an inter-layer insulation layer on the etch stop layer; and
   performing a self-aligned contact (SAC) etching process selectively etching the inter-layer insulation layer, the etch stop layer, the second nitride layer and the oxide layer until the SAC etching process is stopped at the first nitride layer to thereby form a contact hole exposing the first nitride layer.

2. The method of claim 1, wherein the first nitride layer has a thickness ranging from approximately 80 Å to approximately 120 Å.

3. The method of claim 1, wherein the second nitride layer has a thickness ranging from approximately 70 Å to approximately 150 Å.

4. The method of claim 1, wherein the self-aligned contact (SAC) etching process employs a family of $C_xF_y$, in which x and y represent atomic ratios ranging from approximately 1 to approximately 10, as a main etch gas.

5. The method of claim 4, wherein the main etch gas is added to a gas for generating a polymer selected from a group consisting of $CH_2F_2$, $C_3HF_5$ and $CHF_3$.

6. The method of claim 5, wherein the addition of the main gas with the gas for generating the polymer proceeds by using a carrier gas selected from an inert gas group consisting of He, Ne, Ar and Xe.

7. The method of claim 1, wherein the plurality of conductive structures are gate electrode structures.

8. The method of claim 1, wherein the plurality of conductive structures are bit lines.

9. The method of claim 1, wherein the plurality of conductive structures are metal wires.

10. The method of claim 1, before forming the conductive layer and the hard mask layer, further including the step of forming a gate insulation layer on the substrate.

11. The method of claim 1, after the step of performing the SAC etching process, further including the step of removing the first nitride layer by employing a blanket etch-back process to thereby expose the substrate.

12. The method of claim 1, after the step of performing the SAC etching process, further including the steps of:
   forming an attack barrier layer on the exposed whole profile; and
   removing the attack barrier layer and the first nitride layer disposed between the conductive structures by employing a blanket etch-back process; and
   performing a cleaning process.

13. The method of claim 12, wherein the attack barrier layer is made of nitride.

14. The method of claim 13, wherein the attack barrier layer has a thickness ranging from approximately 30 Å to approximately 150 Å.

* * * * *